(12) United States Patent
Yang et al.

(10) Patent No.: US 8,773,857 B2
(45) Date of Patent: Jul. 8, 2014

(54) HEAT SINK MOUNTING DEVICE

(75) Inventors: Chih-Hao Yang, New Taipei (TW);
Xiang-Kun Zeng, Shenzhen (CN);
Bao-Quan Shi, Shenzhen (CN);
Jing-Jun Ni, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 141 days.

(21) Appl. No.: 13/526,604

(22) Filed: Jun. 19, 2012

(65) Prior Publication Data

US 2013/0077251 A1    Mar. 28, 2013

(30) Foreign Application Priority Data

Sep. 27, 2011    (CN) ........................ 2011 1 0293922

(51) Int. Cl.
*H05K 7/20*    (2006.01)
*H01L 23/467*    (2006.01)
*H01L 23/40*    (2006.01)
*G06F 1/20*    (2006.01)
*F16B 39/10*    (2006.01)

(52) U.S. Cl.
CPC .............. *H01L 23/467* (2013.01); *H01L 23/40* (2013.01); *G06F 1/20* (2013.01); *F16B 39/10* (2013.01)
USPC .................. 361/709; 361/679.47; 361/679.54; 361/704; 361/707; 361/719; 165/80.2; 165/80.3; 165/104.33; 165/185; 257/706; 257/707; 257/718; 257/719; 411/371.2; 411/352; 411/508; 411/552

(58) Field of Classification Search
CPC ........ H05K 7/20; H01L 23/467; H01L 23/40; H01L 23/34; B62D 7/22; B62D 11/00; G06F 1/20; F28F 9/00; F16B 39/10; F16B 21/10; F16B 13/00; F16B 21/18
USPC ....................... 361/679.46–679.55, 690–697, 361/700–715, 719–724; 165/80.2, 80.3, 165/80.4, 80.5, 104.33, 121–126, 104.26, 165/104.29, 185; 257/706–727; 174/15.1, 174/16.3, 252; 411/149, 150, 155, 156, 411/252, 371.2, 372.3, 508, 509, 544, 552, 411/553
See application file for complete search history.

(56) References Cited

U.S. PATENT DOCUMENTS

| | | | | |
|---|---|---|---|---|
| 5,688,093 | A * | 11/1997 | Bowers | 411/552 |
| 6,307,748 | B1 * | 10/2001 | Lin et al. | 361/704 |
| 6,317,328 | B1 * | 11/2001 | Su | 361/704 |
| 6,331,937 | B1 * | 12/2001 | Bartyzel | 361/679.54 |
| 6,786,691 | B2 * | 9/2004 | Alden, III | 411/371.2 |
| 7,057,897 | B2 * | 6/2006 | Leu | 361/704 |

(Continued)

*Primary Examiner* — Michail V Datskovskiy
(74) *Attorney, Agent, or Firm* — Novak Druce Connolly Bove + Quigg LLP

(57) ABSTRACT

A heat sink mounting device includes a touching plate and a mounting member. The touching plate defines a locking hole. The mounting member includes a locking post. The locking post includes a body and two protrusions protruding from the body. An inner surface of the locking hole defines two cutouts. The touching plate includes two blocking blocks extending from an edge of the locking hole on a bottom surface of the touching plate. The two protrusions extend out of the two cutouts and abut the bottom surface of the touching plate. One of the two protrusions is located between the two blocking blocks, to prevent the body from rotating freely in the locking hole.

17 Claims, 6 Drawing Sheets

(56) References Cited

U.S. PATENT DOCUMENTS

| | | | |
|---|---|---|---|
| 7,333,340 B2* | 2/2008 | Zhang et al. | 361/719 |
| 7,606,031 B2* | 10/2009 | Hsieh et al. | 361/700 |
| 7,701,720 B2* | 4/2010 | Colbert et al. | 361/719 |
| 7,869,217 B2* | 1/2011 | Chen et al. | 361/710 |
| 8,479,804 B2* | 7/2013 | Liu | 165/80.2 |
| 2006/0232944 A1* | 10/2006 | Zhang et al. | 361/719 |
| 2007/0217159 A1* | 9/2007 | Long et al. | 361/704 |
| 2008/0219754 A1* | 9/2008 | Lee | 403/42 |
| 2009/0110511 A1* | 4/2009 | Cheng | 411/349 |
| 2010/0220443 A1* | 9/2010 | Li | 361/679.58 |
| 2010/0246132 A1* | 9/2010 | Cao et al. | 361/704 |
| 2011/0146954 A1* | 6/2011 | Liu | 165/104.26 |
| 2011/0261532 A1* | 10/2011 | Yang | 361/697 |
| 2012/0181008 A1* | 7/2012 | Lin et al. | 165/185 |

* cited by examiner

HEAT SINK MOUNTING DEVICE

BACKGROUND

1. Technical Field

The present disclosure relates to mounting devices, and particularly to a mounting device for a heat sink.

2. Description of Related Art

Heat sinks are used for cooling electronic devices, such as computers. Many heat sinks are secured to the computer by screws. However, the screws may easily become loose and the heat sink becomes loosely secured to the computer as a result. Therefore, an improved heat sink mounting device is desired within the art.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
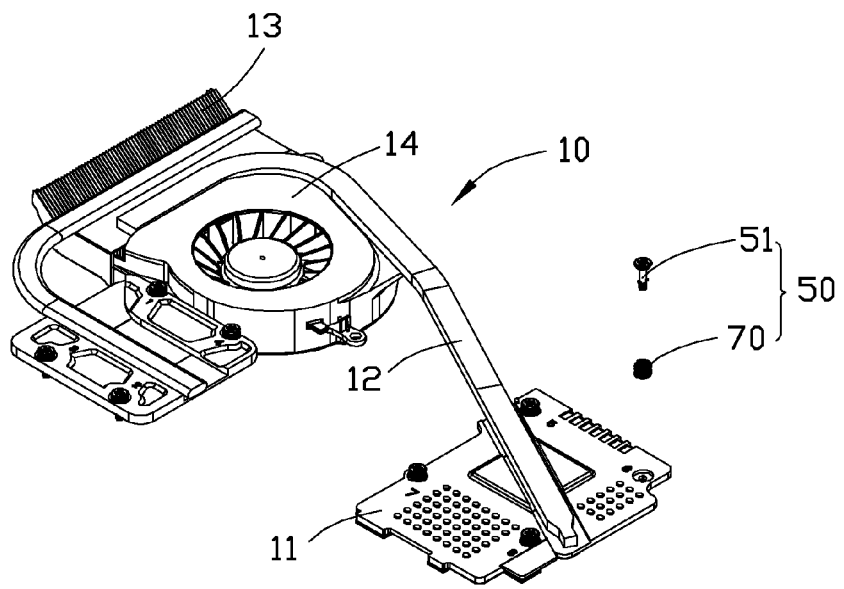
FIG. 1 is an exploded, isometric view of a heat sink mounting device in accordance with an embodiment.
Figure 1:
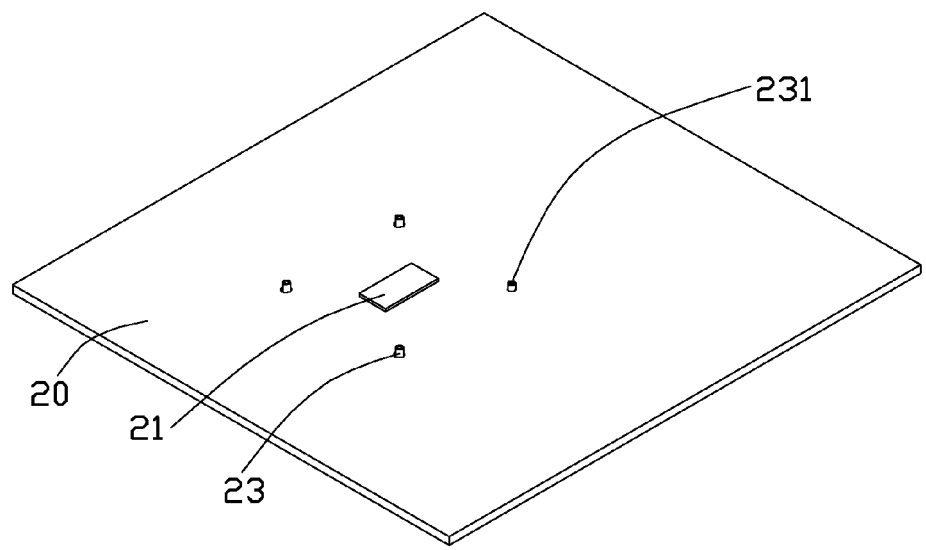
Figure 2:
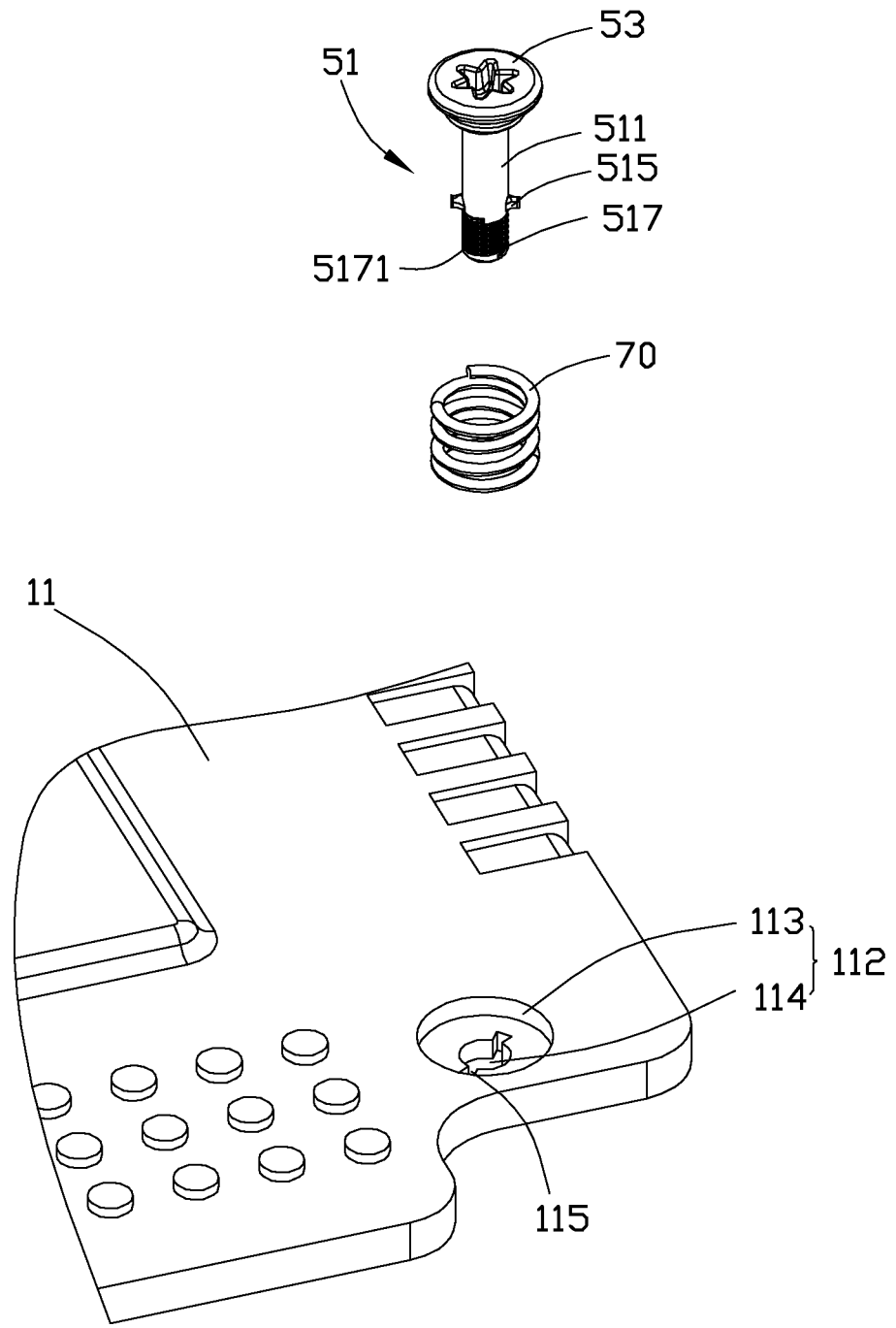
FIG. 2 is an exploded, isometric view of a mounting member and a touching plate of FIG. 1.

FIG. 1 and FIG. 2 show a heat sink mounting device in accordance with an embodiment. The heat sink mounting device secures a heat sink 10 to a circuit board 20.

The heat sink 10 includes a touching plate 11, a heat pipe 12, a plurality of fins 13, and a fan 14. A heat element 21 is secured to the circuit board 20. The circuit board 20 includes four mounting posts 23 located on four corners of the heat element 21. Each of the four mounting posts 23 is hollow and defines a threaded hole 231. A bottom surface of the touching plate 11 contacts with the heat element 21. A top surface of the touching plate 11 is connected a first end of the heat pipe 12. A second end of the heat pipe 12 is connected to the plurality of fins 13. The top surface of the touching plate 11 is opposite to the bottom surface of the touching plate 11. The first end of the heat pipe 12 is opposite to the second end of the heat pipe 12. The plurality of the fins 13 are adjacent to an air outlet of the fan 14. Heat generated from the heat element 21 is transmitted to the touching plate 11. The heat pipe 12 transmits the heat to the plurality of fins 13 from the touching plate 11. The fan 14 works to disperse the heat from the plurality of fins 13 and cool the heat element 21.

Figure 3:
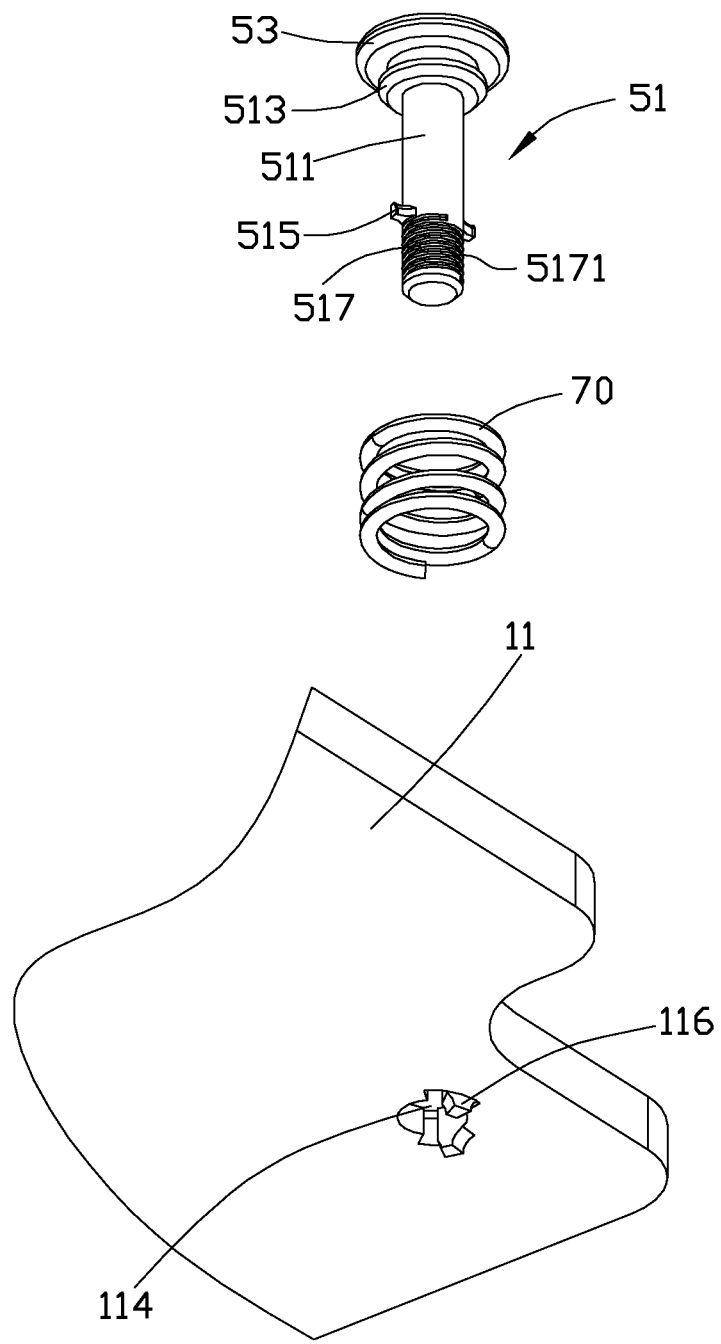
FIG. 3 is similar to FIG. 2, but viewed from a different aspect.
Figure 4:
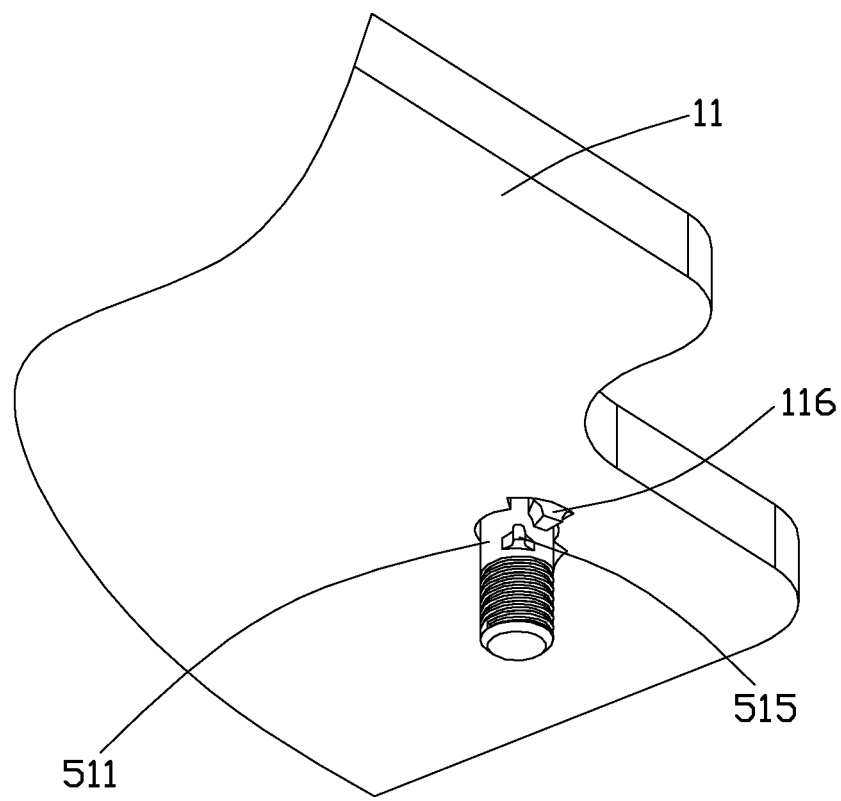
FIG. 4 is an assembled, isometric view of the mounting member and the touching plate of FIG. 2.
Figure 5:
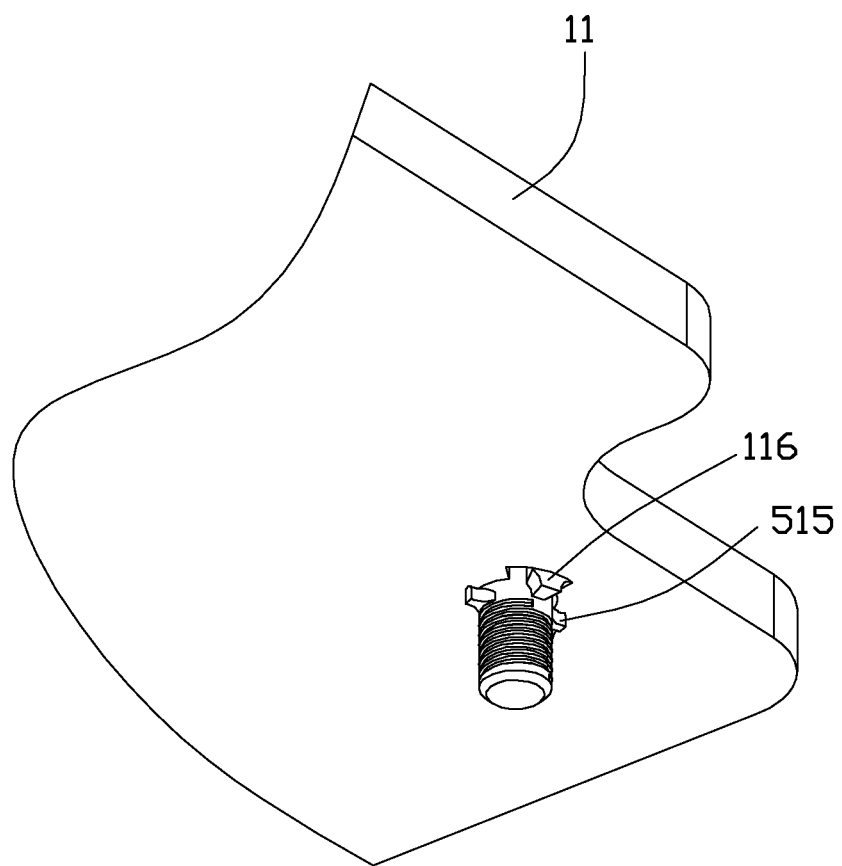
FIG. 5 is similar to FIG. 4, but the mounting member is in a different state.
Figure 6:
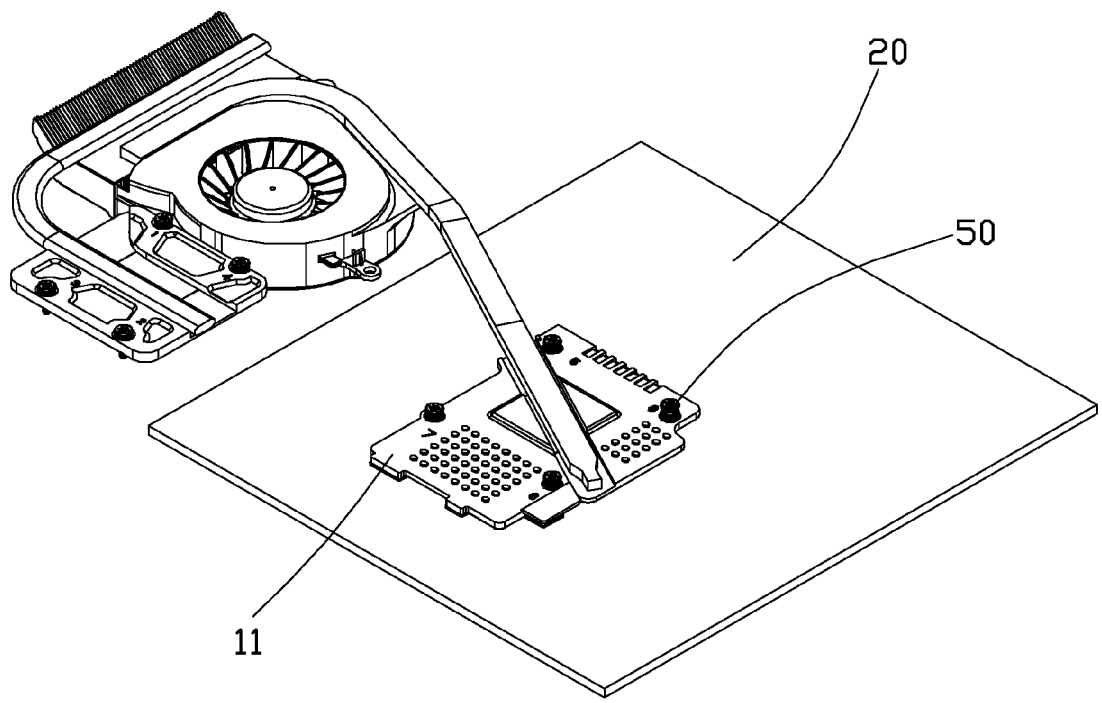
FIG. 6 is an isometric view of assembled heat sink mounting device of FIG. 1.

FIGS. 1-3 show the heat sink mounting device further includes four mounting members 50. The four mounting members 50 are located on four corners of the touching plate 11 corresponding to the four mounting posts 23. Each mounting member 50 includes a locking post 51 and a spring 70. The locking post 51 includes a body 511 and a head portion 53 located on the body 511. In one embodiment, a cross section of the locking post 51 is circular. A diameter of the head portion 53 is greater than a diameter of the body 511. A limiting portion 513 is located on and surrounds the body 511 and is adjacent to the head portion 53. A diameter of the limiting portion 513 is greater than the diameter of the body 511 and smaller than the diameter of the head portion 53. Two protrusions 515 protrude from a lower portion of the body 511. The two protrusions 515 are symmetrical about a central axis of the body 511. The body 511 includes a locking portion 517 under the two protrusions 515. The locking portion 517 includes a plurality of outer threads 5171 corresponding to the threaded hole 231.

The touching plate 11 defines four mounting holes 112 corresponding to the four mounting members 50. Each of the four mounting holes 112 is a stepped hole and includes a receiving hole 113 and a locking hole 114 communicating with the receiving hole 113. The receiving hole 113 communicates to the top surface of the touching plate 11. The locking hole 114 communicates with the bottom surface of the touching plate 11. In one embodiment, the receiving hole 113 and the locking hole 114 are circular. A diameter of the receiving hole 113 is greater than a diameter of the locking hole 114. The diameter of the locking hole 114 is substantially equal to the diameter of the body 511. An inner surface of the locking hole 114 defines two cutouts 115. The two cutouts 115 are symmetrical about a central axis of the locking hole 114. The touching plate 111 further includes two blocking blocks 116 extending from an edge of the locking hole 114 on the bottom surface of the touching plate 111.

The spring 70 is a linear compression spring. An outer diameter of the spring 70 is smaller than the diameter of the receiving hole 113. An inner diameter of the spring 70 is greater than the diameter of the body 511 and smaller than the diameter of the limiting portion 513.

FIGS. 1-6 show that, in assembly of the mounting member 50, the spring 70 surrounds the body 511, a first end of the spring 70 abuts the limiting portion 513, and each of the two protrusions 515 aligns with each of the two cutouts 115. The body 511 is inserted into the locking hole 114. The two protrusions 515 are inserted through the two cutouts 115, and a second end of the spring 70 is received in the receiving hole 113. The body 511 is further moved along the locking hole 114 so that the spring 70 is elastically deformed by the touching plate 11. Once the two protrusions 515 extend out of the two blocking blocks 116, the body 511 is rotated in the locking hole 114 to resist one of the two protrusions 515 for alignment between the two blocking blocks 116. In this position, the locking post 51 is released. The spring 70 rebounds to push the body 511 to move upwards until the two protrusions 515 abut the bottom surface of the touching plate 11. One of the two protrusions 515 is located between the two blocking blocks 116, to restrict the mounting member 50 from rotating freely in the mounting hole 112.

To mount the heat sink 10 on the circuit board 20, the heat sink 10 is moved to adjacent to the circuit board 20, and the four mounting members 50 are aligned with the four threaded holes 231. The head portion 53 of each mounting member 50 is pressed downwards so that the body 511 is moved downwards in the locking hole 114 and extends out of the blocking blocks 116 to the threaded hole 231. The locking post 51 is rotated until the locking portion 517 is threaded with the threaded hole 231, and one of the two protrusions 515 is aligned between the two blocking blocks 116. In this position, the heat sink 10 is secured to the circuit board 20, with the spring 70 rebounding to push the body 511 to move relative to the touching plate 11 in the locking hole 114, until one of the two protrusions 515 is located between the two blocking blocks 116, and the bottom surface of the touching plate 11 abuts the heat element 21.

Because one of the two protrusions 515 is located between the two blocking blocks 116, the locking portion 517 is restricted from rotating freely in the threaded hole 231. Thus, locking post 51 is restricted from being loosened from the threaded hole 231.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A heat sink mounting device, comprising:
   a touching plate defining a locking hole; and
   a mounting member comprising:
      a locking post comprising a body, a limiting portion located on the body, and two protrusions protruding from the body; and
      a spring surrounding the body;
   wherein an inner surface of the locking hole defines two cutouts; the touching plate comprises two blocking blocks, and each of the two blocking blocks being extended from an edge of the locking hole on a bottom surface of the touching plate; a first end of the spring abuts the limiting portion, and a second end of the spring abuts a top surface of the touching plate; the bottom surface of the touching plate is opposite to the top surface of the touching plate; the first end of the spring is opposite to the second end of the spring; each of the two protrusions extends out of each of the two cutouts and abuts the bottom surface of the touching plate; and one of the two protrusions is located between the two blocking blocks thereby preventing the body from rotating in the locking hole.

2. The heat sink mounting device of claim 1, wherein the touching plate further defines a receiving hole communicating with the locking hole, the receiving hole and the locking hole are circular, and a diameter of the receiving hole is greater than a diameter of the locking hole; and the second end of the spring is received in the receiving hole.

3. The heat sink mounting device of claim 1, wherein the body comprises a locking portion, and the locking portion comprises a plurality of outer threads; the heat sink mounting device further comprises a circuit board, the circuit board defines a threaded hole, and the locking portion is engaged in the threaded hole.

4. The heat sink mounting device of claim 3, wherein a mounting post is located on the circuit board, and the threaded hole is defined in the mounting post.

5. The heat sink mounting device of claim 1, wherein the locking post further comprises a head portion connected to the body, a cross section of each of the limiting portion and the head portion is circular, and a diameter of the head portion is greater than a diameter of the limiting portion.

6. The heat sink mounting device of claim 1, wherein the two protrusions are symmetrical about a central axis of the body.

7. The heat sink mounting device of claim 1, wherein the two cutouts are symmetrical about a central axis of the locking hole.

8. The heat sink mounting device of claim 7, wherein the two blocking blocks are located in a side of one of the two cutouts.

9. A heat sink mounting device, comprising:
   a touching plate defining a locking hole; and
   a mounting member comprising a locking post; the locking post comprising a body and two protrusions protruding from the body;
   wherein an inner surface of the locking hole defines two cutouts; the touching plate comprises two blocking blocks, and each of the two blocking blocks being extended from an edge of the locking hole on a bottom surface of the touching plate; each of the two protrusions extends out of each of the two cutouts and abuts the bottom surface of the touching plate; and one of the two protrusions is located between the two blocking blocks thereby preventing the body from rotating in the locking hole.

10. The heat sink mounting device of claim 9, wherein the mounting member further comprise a spring, and the locking post further comprises a limiting portion located on the body; a first end of the spring abuts the limiting portion, and a second end of the spring abuts a top surface of the touching plate; the bottom surface of the touching plate is opposite to the top surface of the touching plate; and the first end of the spring is opposite to the second end of the spring.

11. The heat sink mounting device of claim 9, wherein the touching plate further defines a receiving hole communicating with the locking hole, the receiving hole and the locking hole are circular, and a diameter of the receiving hole is greater than a diameter of the locking hole; and the second end of the spring is received in the receiving hole.

12. The heat sink mounting device of claim 9, wherein the body comprises a locking portion, and the locking portion comprises a plurality of outer threads; the heat sink mounting device further comprises a circuit board, the circuit board defines a threaded hole, and the locking portion is engaged in the threaded hole.

13. The heat sink mounting device of claim 12, wherein a mounting post is located on the circuit board, and the threaded hole is defined in the mounting post.

14. The heat sink mounting device of claim 10, wherein the locking post further comprises a head portion connected to the body, a cross section of each of the limiting portion and the head portion is circular, and a diameter of the head portion is greater than a diameter of the limiting portion.

15. The heat sink mounting device of claim 9, wherein the two protrusions are symmetrical about a central axis of the body.

16. The heat sink mounting device of claim 9, wherein the two cutouts are symmetrical about a central axis of the locking hole.

17. The heat sink mounting device of claim 16, wherein the two blocking blocks are located in a side of one of the two cutouts.

* * * * *